United States Patent
Li et al.

(10) Patent No.: US 10,943,902 B2
(45) Date of Patent: Mar. 9, 2021

(54) FORMING STRAINED CHANNELS FOR CMOS DEVICE FABRICATION

(71) Applicant: International Business Machines Corporation, Armonk, NY (US)

(72) Inventors: Juntao Li, Cohoes, NY (US); Kangguo Cheng, Schenectady, NY (US); John G. Gaudiello, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/539,738

(22) Filed: Aug. 13, 2019

(65) Prior Publication Data
US 2019/0363082 A1   Nov. 28, 2019

Related U.S. Application Data

(62) Division of application No. 15/864,577, filed on Jan. 8, 2018, now Pat. No. 10,593,672.

(51) Int. Cl.
*H01L 27/092* (2006.01)
*H01L 29/78* (2006.01)
(Continued)

(52) U.S. Cl.
CPC ........ *H01L 27/092* (2013.01); *H01L 21/0243* (2013.01); *H01L 21/0245* (2013.01); *H01L 21/02381* (2013.01); *H01L 21/02433* (2013.01); *H01L 21/02532* (2013.01); *H01L 21/02658* (2013.01); *H01L 21/823807* (2013.01); *H01L 21/823821* (2013.01); *H01L 27/0924* (2013.01); *H01L 29/1054* (2013.01);
(Continued)

(58) Field of Classification Search
None
See application file for complete search history.

(56) References Cited

U.S. PATENT DOCUMENTS 7,384,830 B2   6/2008 Cohen
7,429,775 B1   9/2008 Nayak et al.
(Continued)

FOREIGN PATENT DOCUMENTS

EP   2682983 A1   1/2014

OTHER PUBLICATIONS

List of IBM Patents or Patent Applications Treated as Related.

*Primary Examiner* — Zandra V Smith
*Assistant Examiner* — Lawrence C Tynes, Jr.
(74) *Attorney, Agent, or Firm* — Randall Bluestone; Ryan, Mason & Lewis, LLP

(57) ABSTRACT

A method for manufacturing a semiconductor device includes growing a first strained semiconductor layer on a substrate, the first strained semiconductor layer having a first type of strain, wherein the substrate comprises a first crystalline orientation at a top surface of the substrate, forming at least one trench in the substrate, wherein exposed sidewalls of the at least one trench have a second crystalline orientation different from the first crystalline orientation, growing a buffer layer in the at least one trench from the exposed sidewalls of the trench, and growing a second strained semiconductor layer on the buffer layer, the second strained semiconductor layer having a second type of strain, wherein the first type of strain is different from the second type of strain.

14 Claims, 11 Drawing Sheets

(51) Int. Cl.
  *H01L 21/02* (2006.01)
  *H01L 29/10* (2006.01)
  *H01L 21/8238* (2006.01)
  *H01L 29/66* (2006.01)

(52) U.S. Cl.
  CPC .... *H01L 29/66628* (2013.01); *H01L 29/7849* (2013.01); *H01L 21/02639* (2013.01)

(56) References Cited

U.S. PATENT DOCUMENTS

| | | | |
|---|---|---|---|
| 7,638,842 B2 | 12/2009 | Currie et al. | |
| 7,662,689 B2 | 2/2010 | Boyanov et al. | |
| 7,888,197 B2 | 2/2011 | Chidambarrao et al. | |
| 8,058,120 B2 | 11/2011 | Ning et al. | |
| 8,237,151 B2 | 8/2012 | Lochtefeld | |
| 8,889,504 B2 | 11/2014 | Dyer et al. | |
| 8,921,886 B2 | 12/2014 | Katsuno et al. | |
| 8,963,205 B2 | 2/2015 | Kim et al. | |
| 9,123,566 B2 | 9/2015 | Mitard et al. | |
| 9,171,904 B2 | 10/2015 | Eneman et al. | |
| 9,368,578 B2 | 6/2016 | Pawlak et al. | |
| 9,425,259 B1 | 8/2016 | Suk et al. | |
| 9,443,873 B1 | 9/2016 | Kerber et al. | |
| 9,530,669 B1 | 12/2016 | Balakrishnan et al. | |
| 9,917,021 B2 | 3/2018 | Cheng et al. | |
| 10,068,963 B2 | 9/2018 | Chiang et al. | |
| 10,522,629 B2 | 12/2019 | Li et al. | |
| 2001/0003364 A1* | 6/2001 | Sugawara | H01L 29/802 257/192 |
| 2001/0045604 A1 | 11/2001 | Oda et al. | |
| 2005/0136584 A1 | 6/2005 | Boyanov et al. | |
| 2006/0019462 A1 | 1/2006 | Cheng et al. | |
| 2006/0226486 A1* | 10/2006 | Kasuga | H01L 29/6678 257/347 |
| 2008/0093622 A1 | 4/2008 | Li et al. | |
| 2008/0116482 A1 | 5/2008 | Chong et al. | |
| 2008/0277734 A1 | 11/2008 | Bhattacharyya et al. | |
| 2009/0020620 A1 | 1/2009 | Baik et al. | |
| 2009/0085125 A1 | 4/2009 | Kim et al. | |
| 2013/0011983 A1 | 1/2013 | Tsai et al. | |
| 2014/0312431 A1 | 10/2014 | Tsai et al. | |
| 2015/0249087 A1* | 9/2015 | Cantoro | H01L 21/845 257/369 |
| 2016/0190304 A1 | 6/2016 | Morin et al. | |
| 2016/0329429 A1 | 11/2016 | Cheng et al. | |
| 2016/0343845 A1 | 11/2016 | Chen | |
| 2017/0040417 A1 | 2/2017 | Cheng et al. | |
| 2017/0092547 A1* | 3/2017 | Tang | H01L 29/20 |
| 2017/0154961 A1 | 6/2017 | Balakrishnan et al. | |

\* cited by examiner

B-B XSECTION (pFET)

A-A XSECTION VIEW (nFET)

C-C XSECTION VIEW (FinFET)

FORMING STRAINED CHANNELS FOR CMOS DEVICE FABRICATION

TECHNICAL FIELD

The field generally relates to semiconductor devices and methods of manufacturing same and, in particular, to forming differently strained (e.g., tensile and compressive) channel regions on the same substrate for NFET and PFET devices.

BACKGROUND

Strain engineering can result in increased performance in semiconductor devices, such as, for example, complementary metal-oxide semiconductor (CMOS) devices. Tensile strain is beneficial for n-type field-effect transistors (NFETs) and compressive strain is beneficial for p-type field-effect transistors (PFETs).

Conventional external strain techniques, such as embedded source/drain regions, and stress liners, have limited effect in some devices, such as fin field-effect transistors (FinFETs), due to the highly scaled pitches and the three-dimensional (3D) nature of a FinFET. Channel strain remains one of few options that continue to provide performance benefits regardless of pitches and device architectures.

Accordingly, there is a need for improved techniques for forming tensile and compressively strained channel regions for NFET and PFET devices.

SUMMARY

According to an exemplary embodiment of the present invention, a method for manufacturing a semiconductor device includes growing a first strained semiconductor layer on a substrate, the first strained semiconductor layer having a first type of strain, wherein the substrate comprises a first crystalline orientation at a top surface of the substrate, forming at least one trench in the substrate, wherein exposed sidewalls of the at least one trench have a second crystalline orientation different from the first crystalline orientation, growing a buffer layer in the at least one trench from the exposed sidewalls of the trench, and growing a second strained semiconductor layer on the buffer layer, the second strained semiconductor layer having a second type of strain, wherein the first type of strain is different from the second type of strain.

According to an exemplary embodiment of the present invention, a semiconductor device includes a first strained semiconductor layer on a substrate, the first strained semiconductor layer having a first type of strain, wherein the substrate comprises a first crystalline orientation at a top surface of the substrate, at least one trench in the substrate, wherein sidewalls of the at least one trench have a second crystalline orientation different from the first crystalline orientation, a buffer layer in the at least one trench, and a second strained semiconductor layer on the buffer layer, the second strained semiconductor layer having a second type of strain, wherein the first type of strain is different from the second type of strain.

According to an exemplary embodiment of the present invention, a method for manufacturing a semiconductor device includes growing a first strained semiconductor layer on a substrate, the first strained semiconductor layer having a first type of strain, wherein the first strained semiconductor layer comprises a first semiconductor material, and wherein the substrate comprises a second semiconductor material different from the first semiconductor material, forming a plurality of trenches spaced apart from each other in the substrate, growing a buffer layer in each of the plurality of trenches, and growing a second strained semiconductor layer on each buffer layer, each second strained semiconductor layer having a second type of strain, wherein each second strained semiconductor layer comprises the second semiconductor material, and wherein the first type of strain is different from the second type of strain.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
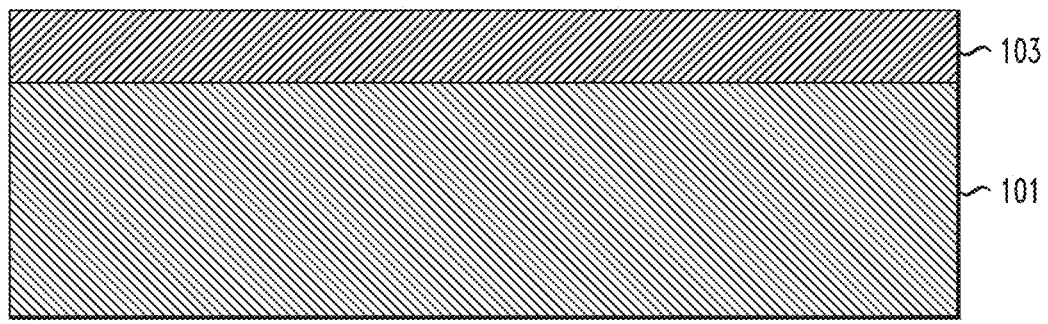
FIG. 1 is a cross-sectional view illustrating growth of a compressively strained semiconductor layer on a substrate in a method of manufacturing a semiconductor device, according to an exemplary embodiment of the present invention.

Exemplary embodiments of the invention will now be discussed in further detail with regard to semiconductor devices and methods of manufacturing same and, in particular, to forming a tensile strained channel region for an NFET and a compressively strained channel region for a PFET on the same chip.

It is to be understood that the various layers and/or regions shown in the accompanying drawings are not drawn to scale, and that one or more layers and/or regions of a type commonly used in, for example, a complementary metal-oxide semiconductor (CMOS), field-effect transistor (FET), nanowire FET, fin field-effect transistor (FinFET), metal-oxide-semiconductor field-effect transistor (MOSFET), vertical FET, single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, FinFETs, nanowire FETs, nanosheet FETs, vertical FETs, SETs, CMOSs and/or MOSFETs. By way of non-limiting example, the semiconductor devices can include, but are not necessarily limited to FET, FinFET, nanowire FET, nanosheet FET, vertical FET, SET, CMOS and MOSFET devices, and/or semiconductor devices that use FET, FinFET, nanowire FET, nanosheet FET, vertical FET, SET CMOS and/or, MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the three-dimensional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings. As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the three-dimensional and/or cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "compressive strain" or "compressively strained" refers to a strain in inner lateral directions (e.g. pushing in inward directions) in a semiconductor layer epitaxially grown on an underlying layer, which is caused by the in-plane lattice constant of the grown layer being larger than the in-plane lattice constant of the underlying layer. As a result of the lattice mismatch, the larger lattice constant of the grown layer is pushed in inward lateral directions to link or align with the smaller lattice constant of the underlying layer. In a non-limiting example, an underlying layer of silicon, which has a smaller in-plane lattice constant than silicon germanium when both silicon and silicon germanium are relaxed, will cause epitaxially grown silicon germanium to experience compressive strain, or be compressively strained.

As used herein, "tensile strain" or "tensile strained" refers to a strain in outer lateral directions (e.g. pulling in outward directions) in a semiconductor layer epitaxially grown on an underlying layer, which is caused by the in-plane lattice constant of the grown layer being smaller than the in-plane lattice constant of the underlying layer. As a result of the lattice mismatch, the smaller lattice constant of the grown layer are pulled in outward lateral directions to link or align with the larger lattice constant of the underlying layer. In a non-limiting example, an underlying layer of silicon germanium, which has a larger in-plane lattice constant than silicon when both silicon and silicon germanium are relaxed, will cause epitaxially grown silicon to experience tensile strain, or be tensile strained.

FIG. 1 is a cross-sectional view illustrating growth of a compressively strained semiconductor layer on a substrate in a method of manufacturing a semiconductor device, according to an exemplary embodiment of the present invention. Referring to FIG. 1, a compressively strained semiconductor layer 103 is epitaxially grown on a semiconductor substrate 101. In accordance with an embodiment of the present invention, the substrate 101 comprises, a semiconductor material including, but not necessarily limited to, silicon (Si), silicon carbide (SiC), Si:C (carbon doped silicon), II-V, III-V compound semiconductor or other like semiconductor. In addition, multiple layers of the semiconductor materials can be used as the semiconductor material of the substrate. In accordance with an embodiment of the present invention, the compressively strained semiconductor layer 103 comprises a semiconductor material including, but not necessarily limited to, silicon germanium (SiGe) or other semiconductor material, which would be compressively strained after epitaxial growth due to mismatched lattice structures with the crystal structure of the material of the underlying substrate 101. Another possible material for the compressively strained layer may include germanium or any other material as long as the epitaxy material and the substrate material have different lattice constants from each other when they are relaxed. In accordance with an embodiment of the present invention, a resulting vertical height (e.g., thickness) of the semiconductor layer 103 after epitaxial growth is about 5 nm to about 100 nm.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 550° C. to 900° C. Although higher temperature typically results in faster deposition, the faster deposition may result in crystal defects and film cracking.

A number of different sources may be used for the epitaxial growth of the compressively strained SiGe layers and the tensile strained Si layers. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, di silane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 2:
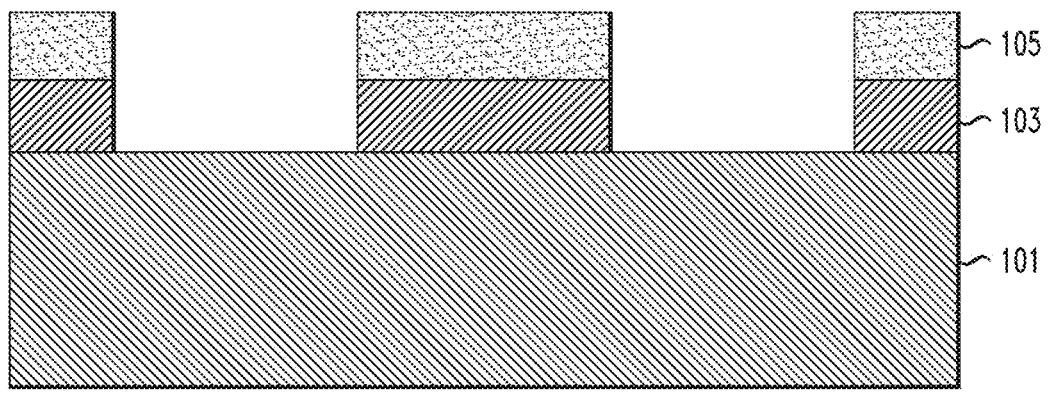
FIG. 2 is a cross-sectional view illustrating formation of a hardmask pattern on and removal of portions of the compressively strained semiconductor layer in a method of manufacturing a semiconductor device, according to an exemplary embodiment of the present invention.

FIG. 2 is a cross-sectional view illustrating formation of a hardmask pattern on and removal of portions of the compressively strained semiconductor layer in a method of manufacturing a semiconductor device, according to an exemplary embodiment of the present invention. Referring to FIG. 2, a hardmask layer including, for example, a dielectric material, such as silicon nitride (SiN), is formed on the compressively strained semiconductor layer 103 and patterned into hardmask portions 105 to form a hardmask pattern. In some embodiments, the hardmask may comprise multiple layers with different materials (e.g., silicon nitride on top of silicon oxide). The hardmask layer can be deposited using deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering.

Portions of the hardmask layer are removed to pattern the hardmask layer into a plurality of patterned hardmask portions 105. The patterning can be performed using, for example, lithography followed by etching, self-aligned multiple-patterning (SAMP) techniques, including, but not necessarily limited to, self-aligned double patterning (SADP), self-aligned quadruple patterning (SAQP) and self-aligned octuple patterning (SAOP). A height of the hardmask portions 105 can be in the range of, but is not necessarily limited to, about 10 nm to about 100 nm.

As shown in FIG. 2, portions of the compressively strained semiconductor layer 103 not covered by the hardmask portions 105 are removed down the substrate 101. In accordance with an embodiment of the present invention, when the compressively strained semiconductor layer 103 includes SiGe, the exposed portions of the semiconductor layer 103 are removed using an etching process, which etches the exposed SiGe selective to the material of the substrate (e.g., silicon). As explained further herein, in accordance with an embodiment of the present invention, the removal of the exposed portions of the compressively strained semiconductor layer 103 defines an n-type region (e.g., NFET region), and the remaining portions of the compressively strained semiconductor layer 103 correspond to a p-type region (e.g., PFET region). The etch can be performed using, for example, directional etch such as reactive ion etch (ME), which results in the structure shown in FIG. 2. The lateral width of the opening can be in a range of, but is not necessarily limited to, about 50 nm to about 200 nm.

Figure 3:
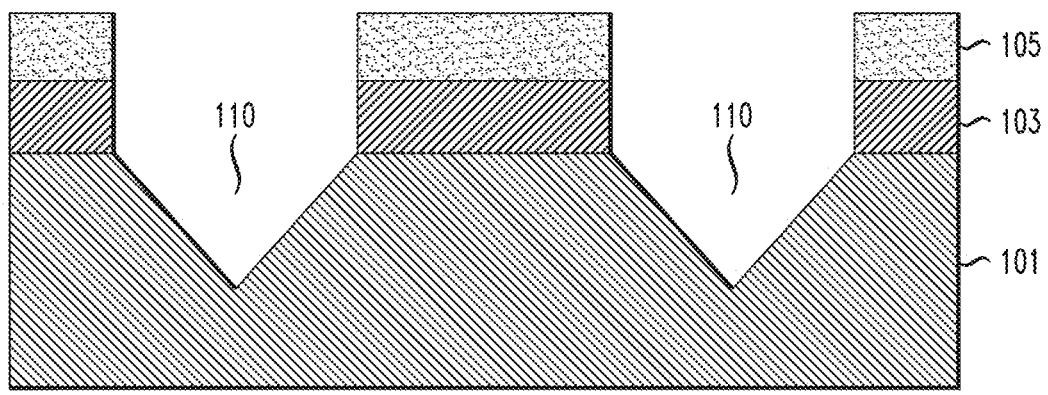
FIG. 3 is a cross-sectional view illustrating formation of trenches in the substrate in an area corresponding to where the portions of the compressively strained semiconductor layer were removed in a method of manufacturing a semiconductor device, according to an exemplary embodiment of the present invention.

FIG. 3 is a cross-sectional view illustrating formation of trenches in the substrate in an area corresponding to where the portions of the compressively strained semiconductor layer were removed in a method of manufacturing a semiconductor device, according to an exemplary embodiment of the present invention. Referring to FIG. 3, in an area corresponding to where the portions of the compressively strained semiconductor layer 103 were removed, trenches 110 are formed in the substrate 101 using, for example, a wet etch containing ammonia ($NH_4OH$), KOH, or TMAH (tetra-methyl-ammonium hydroxide). A depth of the trenches includes, but is not necessarily limited to, about 35 nm to about 140 nm. In some embodiments, the etch rate of the etch process depends on the crystalline orientation of the substrate. The etch process etches Si selective to SiGe. The etch rate of the Si etch is faster on {100} planes and relatively slower on {111} planes. Therefore, the etch is a self-limiting process, meaning the etch stops once all exposed trench sidewalls are {111} planes. According to an embodiment of this invention, the original surface orientation of the substrate of {100} crystalline planes. The exposed sidewalls of the trench after etch have a crystalline orientation of {111} planes.

More specifically, assuming the top surface of the Si is {100} plane, the etch process etches {100} planes much faster than {111} planes. As a result, the {111} trench sidewalls are visible during the etch. Referring to FIG. 3, once two {111} trench sidewalls meet and a sharp trench bottom is formed, the etch essentially stops. This is referred to herein as a "faceted" trench profile or "faceted trench". As a result, {100} planes are eliminated in the trench, leaving only {111} planes, so that in a subsequent step of epitaxy growth, the buffer layer material will rely on {111} planes as a template to grow.

Forming the faceted trench by eliminating the original {100} planes in the trench bottom is important to prevent the buffer layer from growing "bottom-up", where it would primarily rely on a {100} plane Si bottom as the template for epitaxial growth. The bottom-up growth would result in the epitaxial buffer layer (e.g., SiGe) being compressively strained along {100} planes, or it would lead to massive epitaxy defects (e.g., dislocations) in order to obtain relaxed SiGe on Si. In other words, when SiGe is grown bottom up on {100} planes, either compressive strained SiGe is obtained, or relaxed SiGe with epitaxy defects such as dislocations is obtained. The defect density in the relaxed SiGe is above 1000 defects/$cm^2$. When silicon is epitaxially grown on the relaxed SiGe with high defect density, the defects may propagate into the epitaxial silicon layer, degrading device performance and/or yield. In contrast, in accordance with embodiments of the present invention, faceted {111} trench sidewalls are used as the template to obtain an SiGe buffer layer without epitaxy defects. The SiGe buffer layer is still strained along {111} planes, but its lattice constant along {100} plane is substantially the same as the relaxed SiGe (e.g., the absolute value of lattice constant change of the SiGe buffer layer along {100} plane is less than 0.3% in comparison with the lattice constant of relaxed SiGe along {100} plane).

Figure 4:
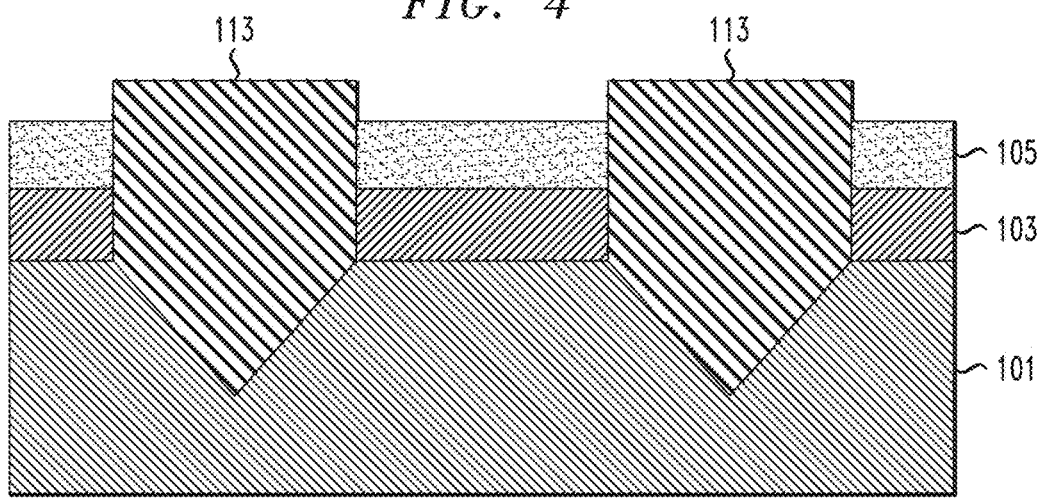
FIG. 4 is a cross-sectional view illustrating growth of buffer semiconductor layers from the trenches in a method of manufacturing a semiconductor device, according to an exemplary embodiment of the present invention.

FIG. 4 is a cross-sectional view illustrating growth of buffer semiconductor layers from the trenches in a method of manufacturing a semiconductor device, according to an exemplary embodiment of the present invention. Referring to FIG. 4, buffer semiconductor layers 113 are epitaxially grown from the trenches 110 to fill in the trenches 110 and an area above the trenches 110 between stacked structures of the hardmask portions 105 on remaining portions of the compressively strained semiconductor layer 103. The buffer semiconductor layers 113 are overgrown to a height above the top surfaces of the hardmask portions 105. In accordance with an embodiment of the present invention, the buffer semiconductor layers 113 include SiGe. As noted above, exposed sidewalls of the trench after etching have a crystalline orientation of {111} planes. Accordingly, the buffer layers 113 are grown on {111} planes, so the buffer layers are strained along {111} planes. However, assuming {100} planes are the top surface of the starting substrate and thus the top surface of the buffer layer, the strain in the buffer layer along the {100} surface is relatively very small. For example, if SiGe with 25% germanium (atomic Ge concentration) is grown along the {111} plane, the buffer SiGe layer would have ~1% compressive strain. Along the {100} plane, the strain is less than 0.3%. After epitaxial growth of the buffer layer 113, the surface of the buffer layer 113 parallel to the top surface of the substrate 101 is substantially free of strain (i.e., the buffer layer is relaxed at the surface parallel to the substrate) (e.g., less than 0.3%). The buffer layers 113 are substantially free of defects, having a defect density less than 100 defects/$cm^2$, where defects include dislocation and stacking faults. In some embodiments, the buffer layers 113 have a defect density less than 10 defects/$cm^2$. In some embodiments, the buffer layers 113 are completely free of defects.

The epitaxially grown SiGe buffer layer is still compressively strained along {111} planes as the grown SiGe layer lattice constant has to match the lattice constant of the Si {111} trench sidewalls. In the orientation perpendicular to the {111} planes, the SiGe buffer layer is tensile strained due to fundamental mechanics. The horizontal {100} surface of the SiGe buffer layer has much smaller strain. The {100} plane can be viewed as a transition between the {111} planes and the planes perpendicular to {111} planes. Therefore, the strain on {100} plane is between the compressive strain on the {111} planes and the tensile strain on the planes perpendicular to the {111} planes. As a result, the strain on the {100} plane is very small. As noted herein, the {100} plane is substantially free of strain, for example, less than 0.3%. The essentially strain-free {100} SiGe is then used as the template to grow Si. Due to the small lattice constant of Si compared to the larger lattice constant of SiGe when both Si and SiGe are relaxed (e.g., free-of-strain), the lattice constant of the epitaxially grown Si has to match the lattice constant of the underlying SiGe. Therefore, the epitaxially grown Si lattice is "stretched," creating a tensile strain along the horizontal {100} planes.

Figure 5:
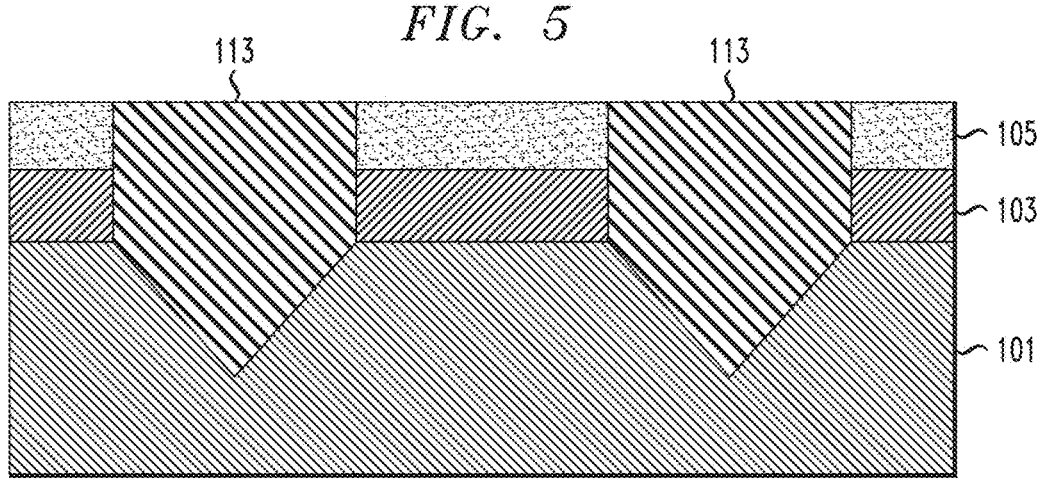
FIG. 5 is a cross-sectional view illustrating planarization of the buffer semiconductor layers in a method of manufacturing a semiconductor device, according to an exemplary embodiment of the present invention.

FIG. 5 is a cross-sectional view illustrating planarization of the buffer semiconductor layers in a method of manufacturing a semiconductor device, according to an exemplary embodiment of the present invention. Referring to FIG. 5, the excess material of the buffer semiconductor layers 113 above the top surfaces of the hardmask portions 105 is removed by, for example, a planarization process, such as, CMP, which is performed down to the hardmask portions 105.

Figure 6:
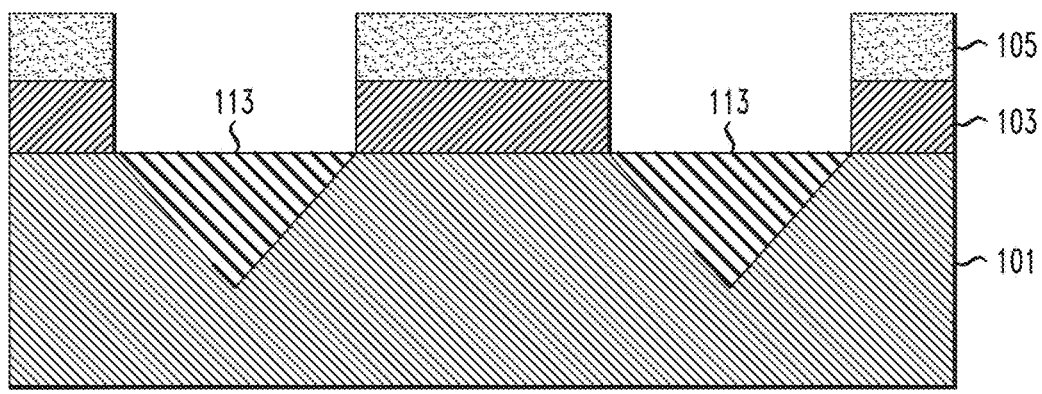
FIG. 6 is a cross-sectional view illustrating recessing of the buffer semiconductor layers in a method of manufacturing a semiconductor device, according to an exemplary embodiment of the present invention.

FIG. 6 is a cross-sectional view illustrating recessing of the buffer semiconductor layers in a method of manufacturing a semiconductor device, according to an exemplary embodiment of the present invention. Referring to FIG. 6, the buffer semiconductor layers 113 are then recessed to be coplanar with a top surface of the substrate 101. In accordance with an embodiment of the present invention, the buffer semiconductor layers and the top surface of the substrate 101 do not need to be perfectly coplanar, and can have a tolerance of ±5 nm. The recessing can be performed using, for example, any suitable etch process such as dry etch or wet etch. For example, SiGe buffer layers 113 can be recessed by hot SC1 solution (a solution with a mix of ammonia and hydrogen peroxide). Alternatively, SiGe can be recessed by reactive ion etch (RIE). Another suitable recess technique includes thermal oxidation or chemical oxidation process to convert a portion of SiGe into oxide and then removing the oxide (e.g., by chemical oxide removal or wet etch containing hydrogen fluoride acid) selective to the remaining SiGe to result in the buffer semiconductor layers 113 being coplanar with a top surface of the substrate 101.

Figure 7:
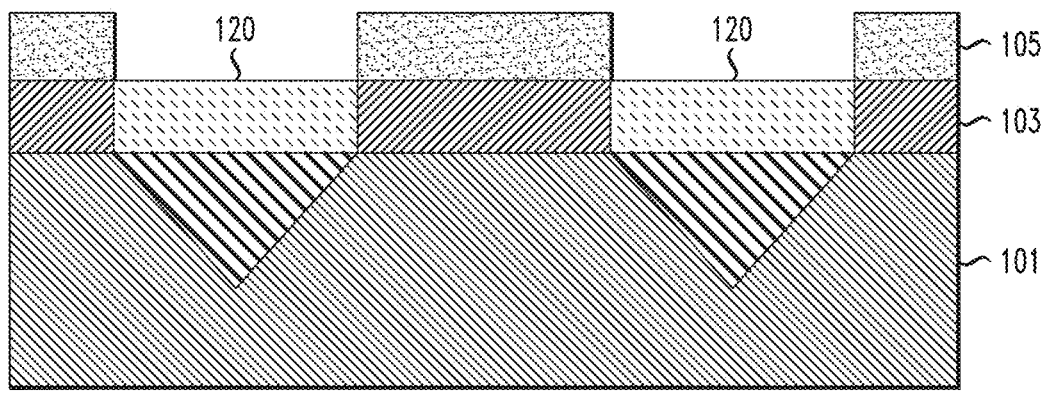
FIG. 7 is a cross-sectional view illustrating growth of tensile strained semiconductor layers on the buffer semiconductor layers in a method of manufacturing a semiconductor device, according to an exemplary embodiment of the present invention.

FIG. 7 is a cross-sectional view illustrating growth of tensile strained semiconductor layers on the buffer semiconductor layers in a method of manufacturing a semiconductor device, according to an exemplary embodiment of the present invention. Referring to FIG. 7, tensile strained semiconductor layers 120 are epitaxially grown on the recessed buffer semiconductor layers 113. In accordance with an embodiment of the present invention, the tensile strained semiconductor layers 120 include silicon, and the buffer semiconductor layers 113 and the compressively strained semiconductor layers 103 include SiGe. As an alternative to silicon, the tensile strained semiconductor layers 120 can include, for example other materials as long as the epitaxy material and the material of the buffer layers 113 have different lattice constants from each other when they are relaxed. As shown in FIG. 7, the tensile strained semiconductor layers 120 are grown to a vertical height so that the top surfaces of the tensile strained semiconductor layers 120 are coplanar with the top surfaces of the compressively strained semiconductor layers 103. The top surfaces of the tensile strained semiconductor layers 120 and compressively strained semiconductor layers 103 do not have to be perfectly coplanar. In some embodiments, they are coplanar with a tolerance +/−3 nm. The compressively and tensile strained semiconductor layers 103, 120 have opposite strain polarities from each other. In some embodiments, the tensile strained semiconductor layers 120 can be overgrown. If so, they can be planarized and then recessed to the target thickness.

Figure 8:
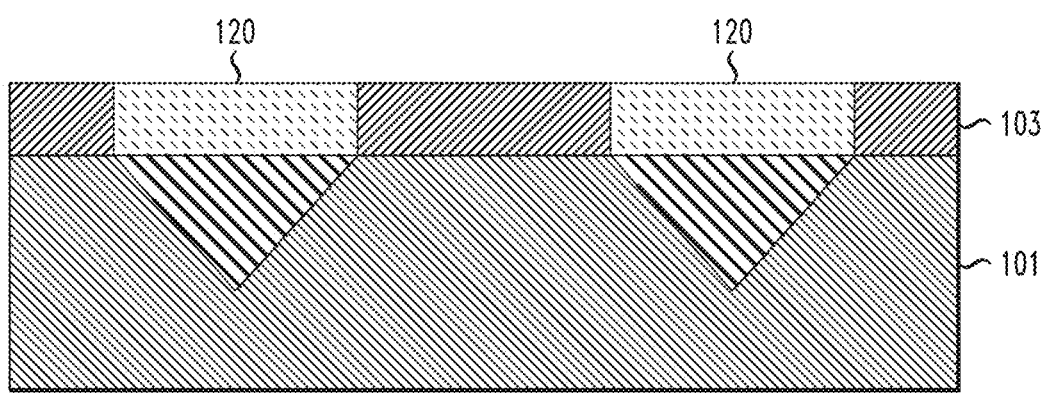
FIG. 8 is a cross-sectional view illustrating removal of the hardmask pattern in a method of manufacturing a semiconductor device, according to an exemplary embodiment of the present invention.

FIG. 8 is a cross-sectional view illustrating removal of the hardmask pattern in a method of manufacturing a semiconductor device, according to an exemplary embodiment of the present invention. Referring to FIG. 8, the hardmask pattern including the hardmask portions 105 is removed using, for example, an etching process such as, for example, wet etch (phosphoric acid for SiN), or dry etch such as plasma etch. The resulting structure in FIG. 8 includes exposed tensile strained semiconductor layers 120 (e.g., tensile strained silicon layers) and exposed compressively strained layers 103 (e.g., compressively strained SiGe layers) on the same substrate 101, which can be used to form different devices on the same chip which respectively benefit from tensile and compressive strain. For example, in accordance with an embodiment of the present invention, the tensile strained semiconductor layers 120 are channel layers, which are formed into the channel regions for NFETs and the compressively strained semiconductor layers 103 are channel layers, which are formed into the channel regions for PFETs on the same chip. In non-limiting examples, planar or fin-type devices can be formed from the structure in FIG. 8.

Figure 9:
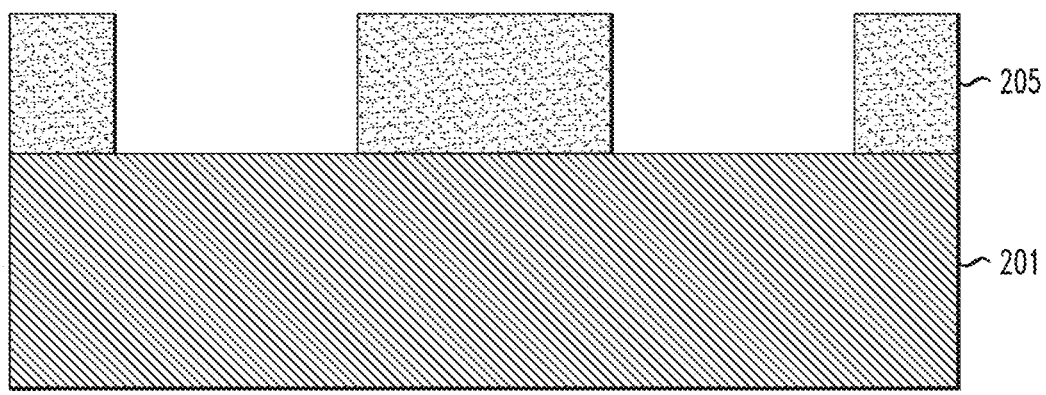
FIG. 9 is a cross-sectional view illustrating formation of a formation of a first hardmask pattern on a substrate in a method of manufacturing a semiconductor device, according to an exemplary embodiment of the present invention.

FIG. 9 is a cross-sectional view illustrating formation of a formation of a first hardmask pattern on a substrate in a method of manufacturing a semiconductor device, according to an exemplary embodiment of the present invention. Referring to FIG. 9, a hardmask layer including, for example, a dielectric material, such as silicon nitride (SiN), is formed on a substrate and patterned into first hardmask portions 205 to form a first hardmask pattern. The hardmask layer can be deposited using deposition techniques including, but not necessarily limited to, CVD, PECVD, RFCVD, PVD, ALD, MLD, MBD, PLD, LSMCD, and/or sputtering. In some embodiments, a planarization process, such as, chemical mechanical planarization (CMP) can be used to remove excess dielectric material.

Portions of the hardmask layer are removed to pattern the hardmask layer into a plurality of patterned first hardmask portions 205. The patterning can be performed using, for example, self-aligned multiple-patterning (SAMP) techniques, including, but not necessarily limited to, self-aligned double patterning (SADP), self-aligned quadruple patterning (SAQP) and self-aligned octuple patterning (SAOP). A height of the first hardmask portions 205 can be in the range of, but is not necessarily limited to, 30 nm to 100 nm.

As explained further herein, in accordance with an embodiment of the present invention, the patterning of the hardmask layer into first hardmask portions 205 defines an n-type region (e.g., NFET region) and a p-type region (e.g., PFET region), where the exposed portions of the substrate 201 correspond to the n-type region and the areas corresponding to the first hardmask portions 205 correspond to the p-type region.

In accordance with an embodiment of the present invention, the substrate 201 comprises, a semiconductor material including, but not necessarily limited to, silicon (Si), silicon carbide (SiC), Si:C (carbon doped silicon), II-V, III-V compound semiconductor or other like semiconductor. In addition, multiple layers of the semiconductor materials can be used as the semiconductor material of the substrate.

Figure 10:
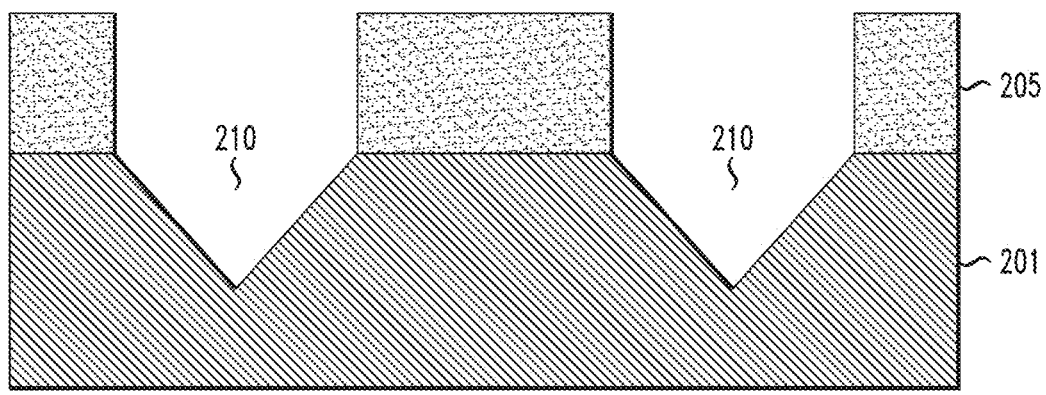
FIG. 10 is a cross-sectional view illustrating formation of trenches in exposed portions of the substrate not covered by the first hardmask pattern in a method of manufacturing a semiconductor device, according to an exemplary embodiment of the present invention.

FIG. 10 is a cross-sectional view illustrating formation of trenches in exposed portions of the substrate not covered by the first hardmask pattern in a method of manufacturing a semiconductor device, according to an exemplary embodiment of the present invention. Referring to FIG. 10, exposed portions of the substrate 201 not covered by the first hardmask portions 205 are removed to form trenches 210 are formed in the substrate 201 using, for example, a wet etch containing ammonia ($NH_4OH$), KOH, or TMAH (tetramethyl-ammonium hydroxide). A depth of the trenches includes, but is not necessarily limited to, about 35 nm to about 140 nm. Similar to what is described in connection with FIG. 4, the etching of the trenches 210 can be a self-limiting process, meaning the etch stops once all exposed trench sidewalls are {111} planes. According to an embodiment of this invention, the original surface orientation of the substrate has a {100} crystalline planes. The exposed sidewalls of the trench after etch have a crystalline orientation of {111} planes.

Figure 11:
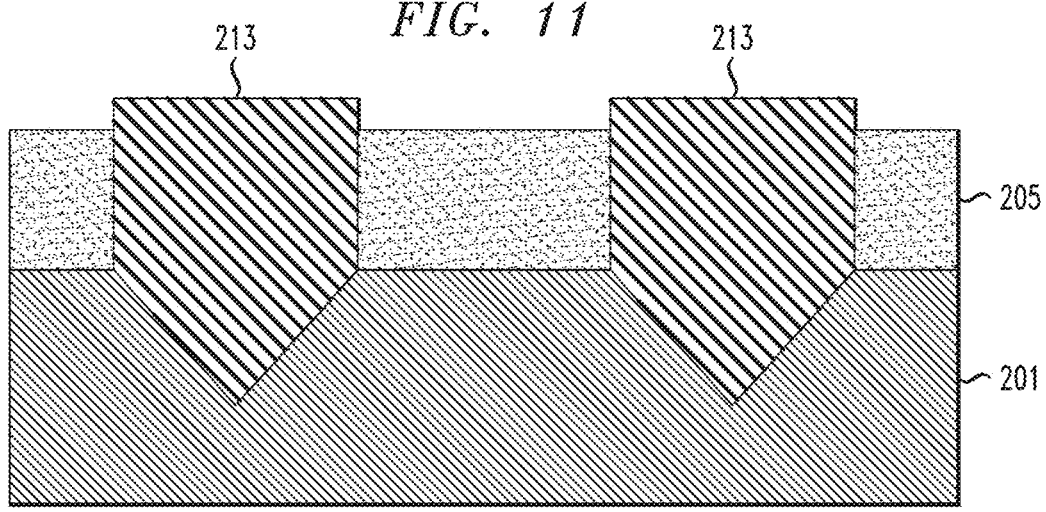
FIG. 11 is a cross-sectional view illustrating growth of buffer semiconductor layers from the trenches in a method of manufacturing a semiconductor device, according to an exemplary embodiment of the present invention.

FIG. 11 is a cross-sectional view illustrating growth of buffer semiconductor layers from the trenches in a method of manufacturing a semiconductor device, according to an exemplary embodiment of the present invention. Referring to FIG. 11, buffer semiconductor layers 213 are epitaxially grown from the trenches 210 to fill in the trenches 210 and an area above the trenches 210 between the first hardmask portions 205. The buffer semiconductor layers 213 are overgrown to a height above the top surfaces of the first hardmask portions 205. In accordance with an embodiment of the present invention, the buffer semiconductor layers 213 include SiGe. Similar to what is discussed in connection with FIG. 4, the buffer layers 213 are grown on {111} planes, so the buffer layers 213 are trained along {111} planes. After epitaxial growth of the buffer layers 213, the surface of the buffer layers 213 parallel to the top surface of the substrate 201 are substantially free of strain (i.e., the buffer layer is relaxed at the surface parallel to the substrate) (e.g., less than 0.3%). The buffer layers 213 are substantially free of defects, having a defect density less than 100 defects/$cm^2$, where defects include dislocation and stacking faults.

Figure 12:
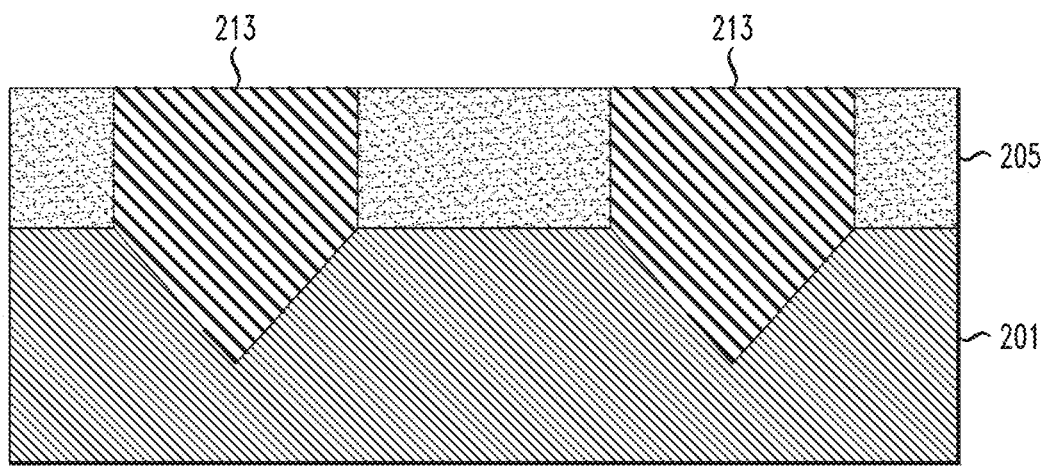
FIG. 12 is a cross-sectional view illustrating planarization of the buffer semiconductor layers in a method of manufacturing a semiconductor device, according to an exemplary embodiment of the present invention.

FIG. 12 is a cross-sectional view illustrating planarization of the buffer semiconductor layers in a method of manufacturing a semiconductor device, according to an exemplary embodiment of the present invention. Referring to FIG. 12, the excess material of the buffer semiconductor layers 213 above the top surfaces of the first hardmask portions 205 is removed by, for example, a planarization process, such as, CMP, which is performed down to the hardmask portions 205.

Figure 13:
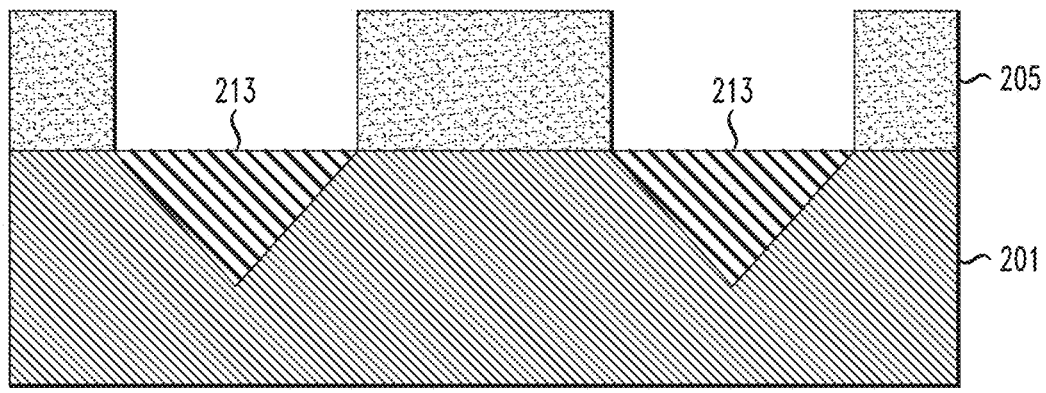
FIG. 13 is a cross-sectional view illustrating recessing of the buffer semiconductor layers in a method of manufacturing a semiconductor device, according to an exemplary embodiment of the present invention.

FIG. 13 is a cross-sectional view illustrating recessing of the buffer semiconductor layers in a method of manufacturing a semiconductor device, according to an exemplary embodiment of the present invention. Referring to FIG. 13, the buffer semiconductor layers 213 are then recessed to be coplanar with a top surface of the substrate 201. The recessing can be performed using, for example, any suitable etch process such as dry etch or wet etch. For example, SiGe buffer layers 213 can be recessed by hot SC1 solution. Alternatively, SiGe can be recessed by reactive ion etch (RIE). Another suitable recess technique includes thermal oxidation or chemical oxidation process to convert a portion of SiGe into oxide and then removing the oxide (e.g., by chemical oxide removal or wet etch containing hydrogen fluoride acid) selective to the remaining SiGe to result in the buffer semiconductor layers 213 being coplanar with a top surface of the substrate 201.

Figure 14:
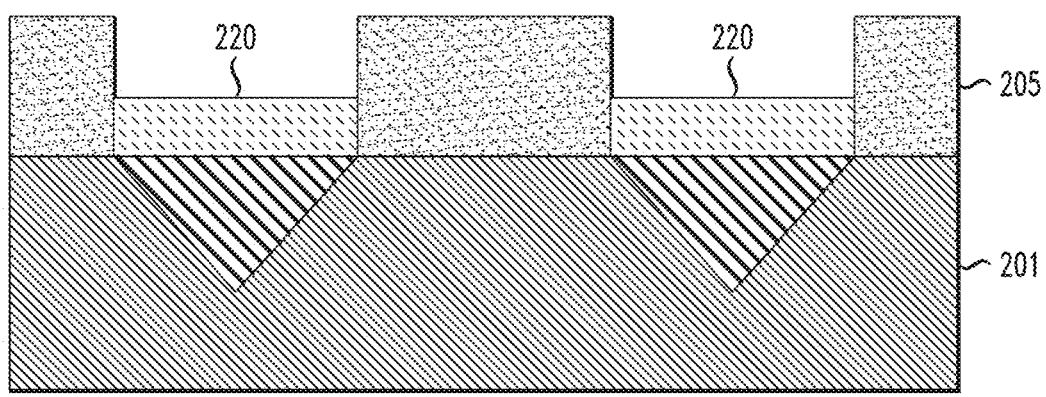
FIG. 14 is a cross-sectional view illustrating growth of tensile strained semiconductor layers on the buffer semiconductor layers in a method of manufacturing a semiconductor device, according to an exemplary embodiment of the present invention.

FIG. 14 is a cross-sectional view illustrating growth of tensile strained semiconductor layers on the buffer semiconductor layers in a method of manufacturing a semiconductor device, according to an exemplary embodiment of the present invention. Referring to FIG. 14, tensile strained semiconductor layers 220 are epitaxially grown on the recessed buffer semiconductor layers 213. In accordance with an embodiment of the present invention, the tensile strained semiconductor layers 220 include silicon, and the buffer semiconductor layers 213 include SiGe. As an alternative to silicon, the tensile strained semiconductor layers 220 can include, for example other materials as long as the epitaxy material and the material of the buffer layers 213 have different lattice constants from each other when they are relaxed. As shown in FIG. 14, the tensile strained semiconductor layers 220 are grown to vertical height, which is less than a vertical height of the first hardmask portions 205 (i.e., below the top surfaces of the first hardmask portions 205).

Alternatively, tensile strained semiconductor layers 220 are over grown above the top surfaces of the first hardmask portions 205. Then, a planarization process, such as, for example, CMP is performed and is stopped on the first hardmask portions 205. The planarized tensile strained semiconductor layers 220 are then recessed to achieve a target vertical height below the top surfaces of the first hardmask portions 205 as shown in FIG. 14. The recessing can be performed using, for example, a chemical oxidation process, which is timed to result in the target vertical height of the strained semiconductor layers 220. The compressively and tensile strained semiconductor layers 203, 220 have opposite strain polarities from each other.

Figure 15:
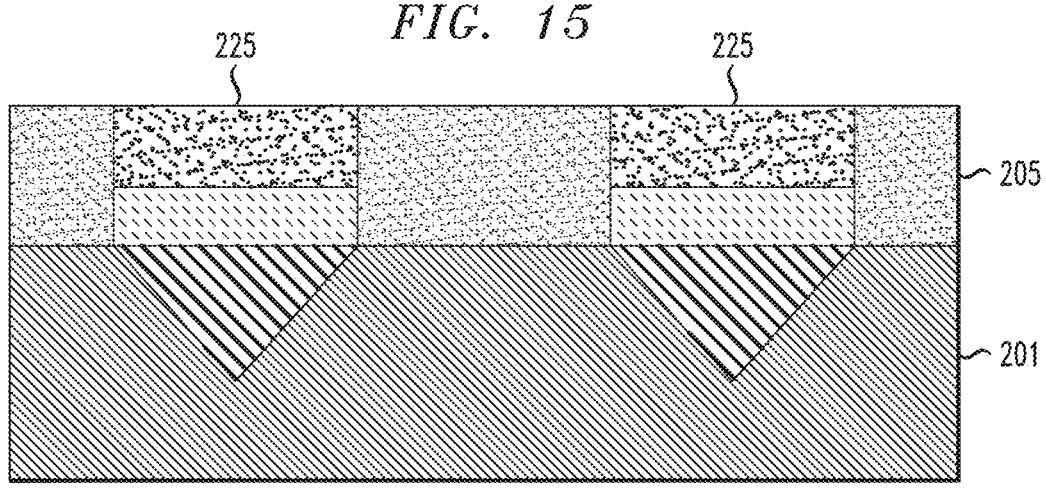
FIG. 15 is a cross-sectional view illustrating formation of a second hardmask pattern on the tensile strained semiconductor layers in a method of manufacturing a semiconductor device, according to an exemplary embodiment of the present invention.

FIG. 15 is a cross-sectional view illustrating formation of a second hardmask pattern on the tensile strained semiconductor layers in a method of manufacturing a semiconductor device, according to an exemplary embodiment of the present invention. Referring to FIG. 15, a hardmask layer including, for example, a dielectric material different from the material of the first hardmask portions 205, such as silicon carbon nitride (SiCN) and/or silicon oxynitride (SiON), is formed on the structure from FIG. 14. The hardmask layer can be deposited using deposition techniques including, but not necessarily limited to, CVD, PECVD, RFCVD, PVD, ALD, MLD, MBD, PLD, LSMCD, and/or sputtering. A planarization process, such as, CMP, which stops on the first hardmask portions 205, is used to remove excess material of the newly deposited hardmask layer. As a result, a second hardmask pattern including second hardmask portions 225 is formed. The second hardmask portions 225 fill in vacant areas on the tensile strained semiconductor layers 220 between the first hardmask portions 205.

Figure 16:
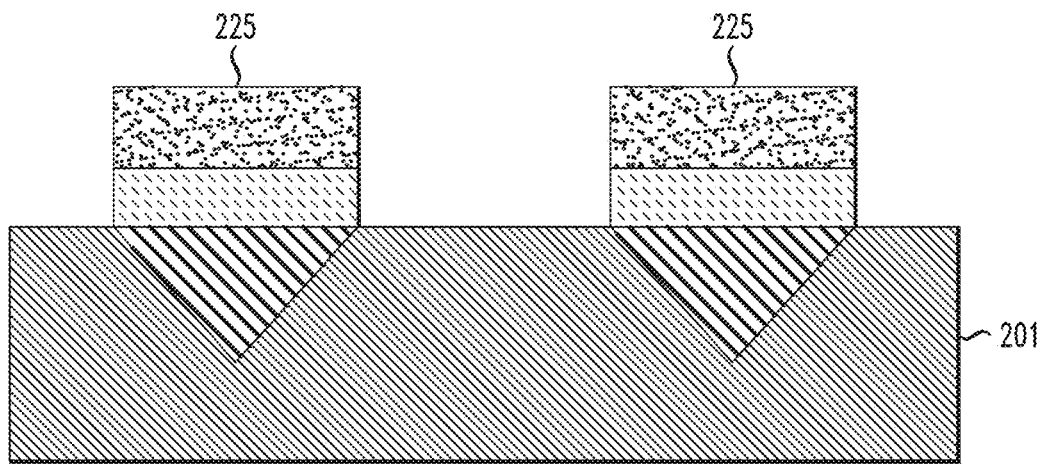
FIG. 16 is a cross-sectional view illustrating selective removal of the first hardmask pattern in a method of manufacturing a semiconductor device, according to an exemplary embodiment of the present invention.

FIG. 16 is a cross-sectional view illustrating selective removal of the first hardmask pattern in a method of manufacturing a semiconductor device, according to an exemplary embodiment of the present invention. Referring to FIG. 16, the first hardmask portions 205 (e.g., SiN) are selectively removed with respect to the second hardmask portions 225 (e.g., SiCN, SiON) down to the substrate 201. The first hardmask portions 205 are removed using, for example, if the first hardmask portions 205 are SiN, a wet etch containing hot phosphoric acid, which can be used to remove the first hardmask portions 205 selective to other materials. The regions where the first hardmask portions 205 are removed correspond to p-type regions.

Figure 17:
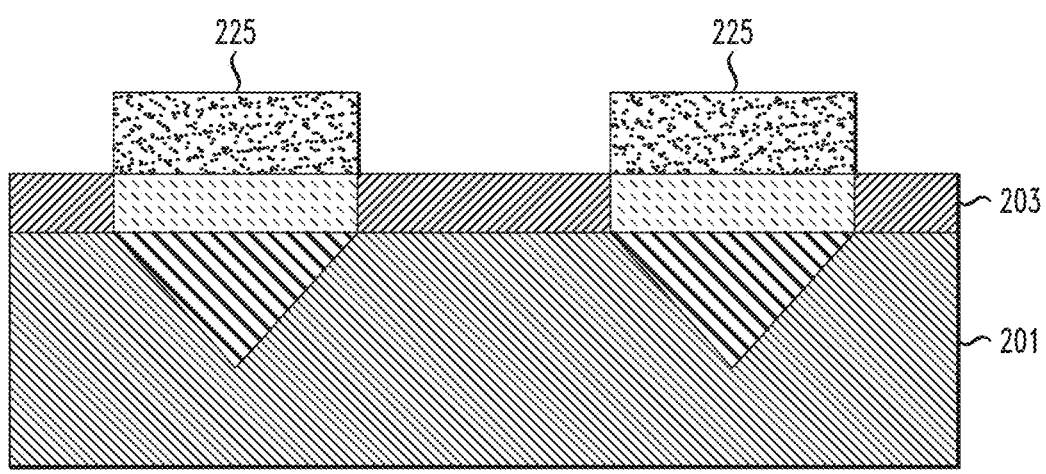
FIG. 17 is a cross-sectional view illustrating growth of compressively strained semiconductor layers on the exposed areas of the substrate after removal of the first hardmask pattern in a method of manufacturing a semiconductor device, according to an exemplary embodiment of the present invention.

FIG. 17 is a cross-sectional view illustrating growth of compressively strained semiconductor layers on the exposed areas of the substrate after removal of the first hardmask pattern in a method of manufacturing a semiconductor device, according to an exemplary embodiment of the present invention. Referring to FIG. 17, compressively strained semiconductor layers 203 are epitaxially grown on the semiconductor substrate 201 in the areas where the first hardmask portions 205 were removed. In accordance with an embodiment of the present invention, the compressively strained semiconductor layers 203 comprise a semiconductor material including, but not necessarily limited to, silicon germanium (SiGe) or other semiconductor material, which would be compressively strained after epitaxial growth due to mismatched lattice structures with the crystal structure of the material of the underlying substrate 201. Another possible material for the compressively strained layer may include germanium or any other material as long as the epitaxy material and the substrate material have different lattice constants from each other when they are relaxed. In accordance with an embodiment of the present invention, the semiconductor layers 203 are grown to have top surfaces coplanar or substantially coplanar within a tolerance (e.g., ±5 nm) with the top surfaces of the tensile strained semiconductor layers 220. In a non-limiting embodiment, a resulting vertical height (e.g., thickness) of the semiconductor layers 203 and tensile strained semiconductor layers 220 is about 5 nm to about 50 nm.

Figure 18:
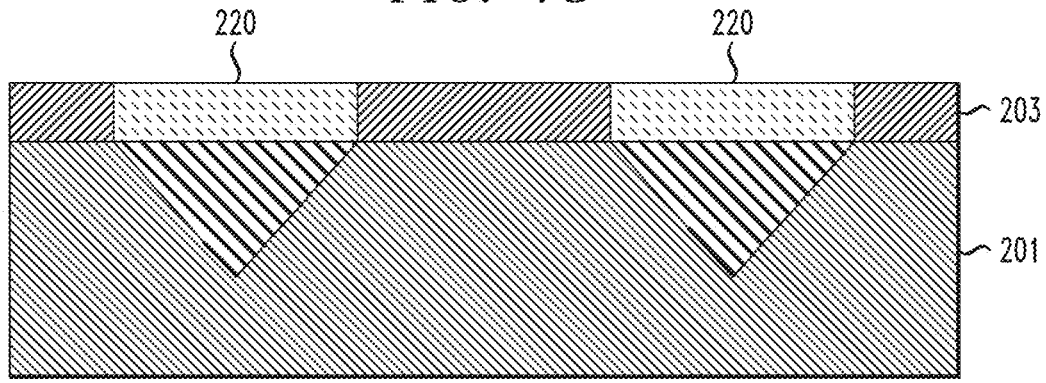
FIG. 18 is a cross-sectional view illustrating removal of the second hardmask pattern in a method of manufacturing a semiconductor device, according to an exemplary embodiment of the present invention.

FIG. 18 is a cross-sectional view illustrating removal of the second hardmask pattern in a method of manufacturing a semiconductor device, according to an exemplary embodiment of the present invention. Referring to FIG. 18, the second hardmask portions 205 are removed using, for example, an etching process such as, for example, wet etch using a solution containing hydrogen fluoride acid can be used to remove SiCO, or dry etch such as reactive ion etch (RIE). The resulting structure in FIG. 18 includes exposed tensile strained semiconductor layers 220 (e.g., tensile strained silicon layers) and exposed compressively strained layers 203 (e.g., compressively strained SiGe layers) on the same substrate 201, which can be used to form different devices on the same chip which respectively benefit from tensile and compressive strain. For example, in accordance with an embodiment of the present invention, the tensile strained semiconductor layers 220 are channel layers, which are formed into the channel regions for NFETs and the compressively strained semiconductor layers 203 are channel layers, which are formed into the channel regions for PFETs on the same chip. In non-limiting examples, planar or fin-type devices can be formed from the structure in FIG. 18.

Figure 19:
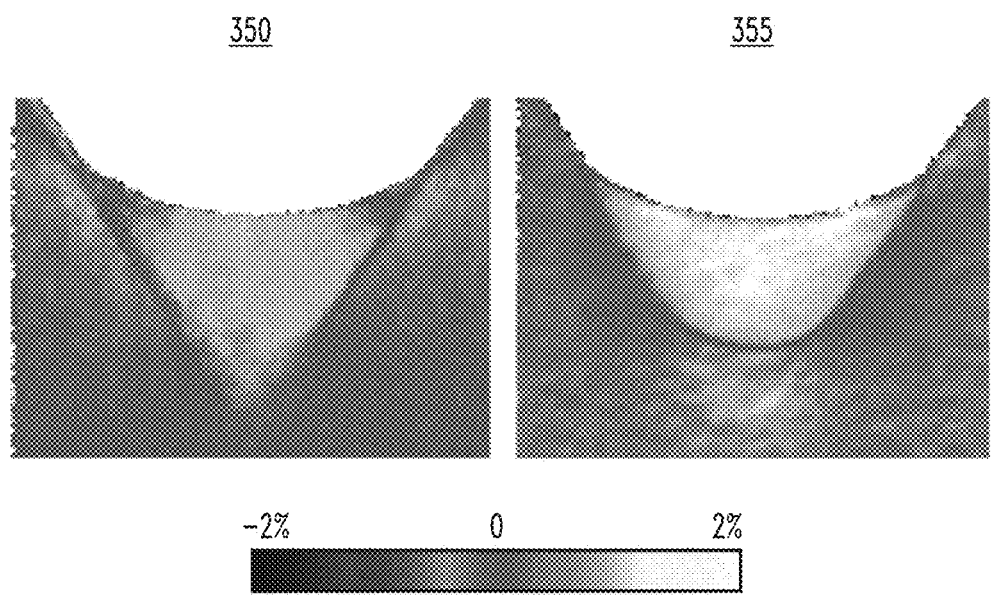
FIG. 19 is an image of in-plane and out-of-plane lattice deformation maps, according to an exemplary embodiment of the present invention.
Figure 20:
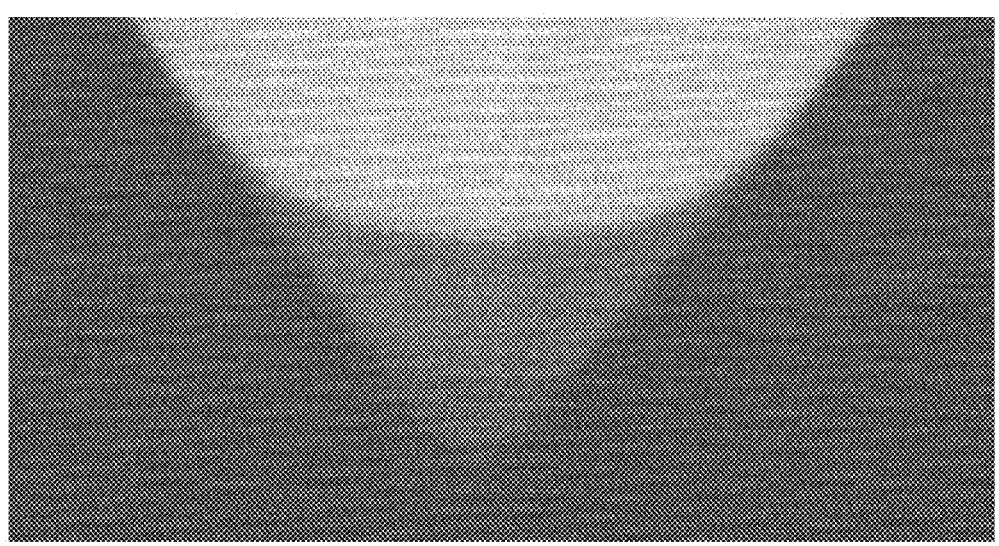
FIG. 20 illustrates a dark field transmission electron microscopy image corresponding to lattice deformation, according to an exemplary embodiment of the present invention.

FIG. 19 is an image of in-plane and out-of-plane lattice deformation maps, according to an exemplary embodiment of the present invention. FIG. 20 illustrates a dark field transmission electron microscopy image corresponding to lattice deformation, according to an exemplary embodiment of the present invention. Referring to FIG. 19, an in-plane (220) lattice deformation map 350 and an out-of-plane (002) lattice deformation map 355 are shown. The lattice deformation is defined as the lattice constant difference between the measured layer and the relaxed silicon substrate as a percentage of the lattice constant of the relaxed silicon substrate. The SiGe buffer layer grown in the faceted trench has a germanium content (atomic concentration) of about 20%. As can be seen, the in-plane lattice deformation of the SiGe buffer layer is about 0.7%, indicating that the in-plane (horizontal) lattice constant of the grown SiGe buffer is very close to the relaxed SiGe with 20% Ge (the theoretical lattice deformation of the relaxed SiGe with 20% Ge is 0.8%). As shown in the dark field transmission electron microscopy image 465 in FIG. 20, the epitaxial SiGe buffer layer is defect-free.

Figure 21:
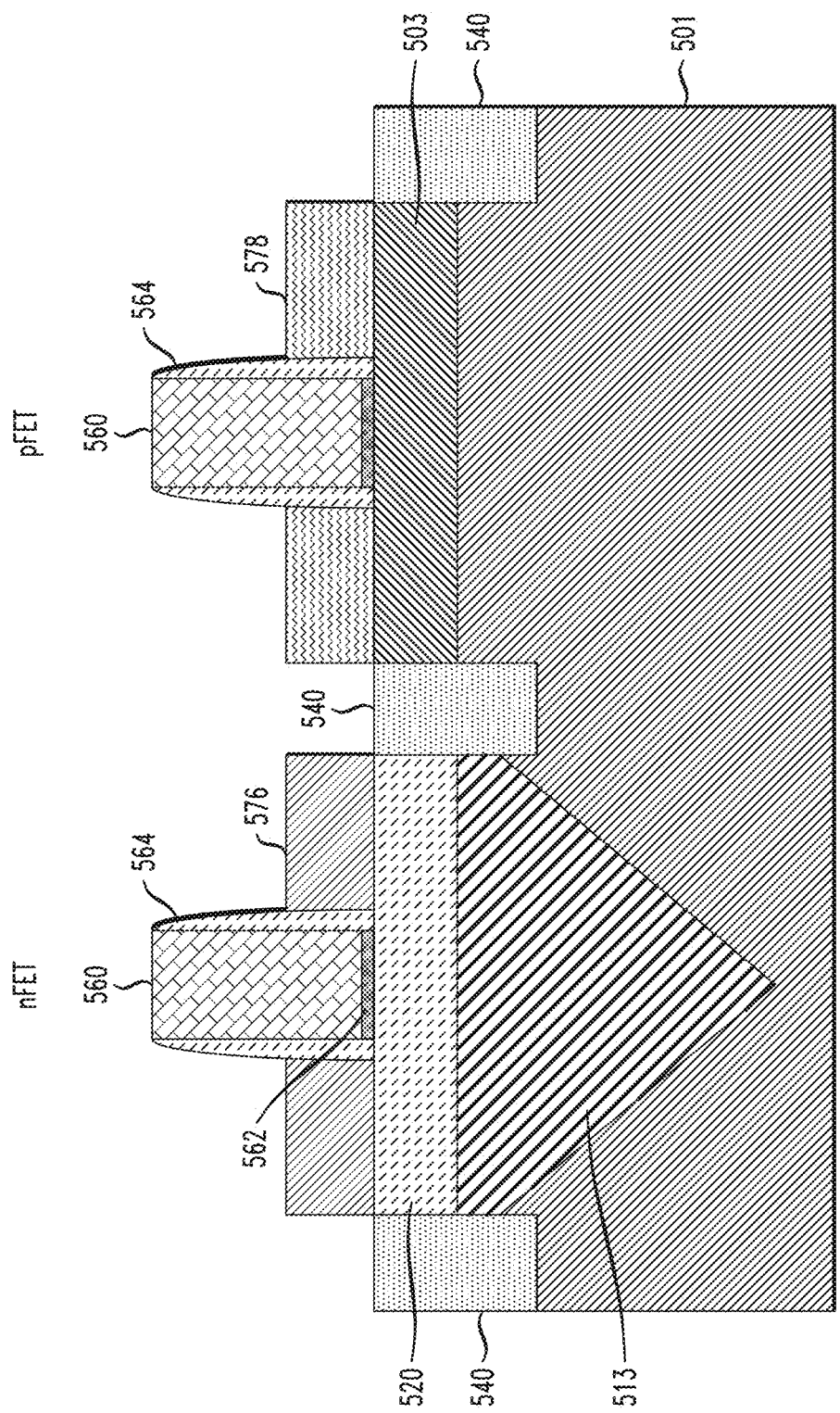
FIG. 21 is a cross-sectional view of a planar complementary metal-oxide semiconductor (CMOS) device, according to an exemplary embodiment of the present invention.

FIG. 21 is a cross-sectional view of a planar complementary metal-oxide semiconductor (CMOS) device, according to an exemplary embodiment of the present invention. Referring to FIG. 21, a planar CMOS device includes an n-type field effect transistor (nFET) on a left side and a p-type field effect transistor (pFET) on a right side formed on a substrate 501 including a compressively strained semiconductor layer 503, a buffer layer 513, and a tensile strained semiconductor layer 520 manufactured in accordance with the embodiments of the present invention described herein. End portions of the compressively strained semiconductor layer 503 and the tensile strained semiconductor layer 520 may be removed where isolation regions 540 (e.g., shallow trench isolation (STI) regions) are formed on the substrate 501. The nFET is formed on the tensile strained semiconductor layer 520 and includes a gate 560 formed on a gate dielectric 562. Dielectric spacers 564 are formed on sides of the gate 560 and gate dielectric 562. Source/drain regions 576 are formed on the tensile strained semiconductor layer 520 on sides of the spacers 564. The source/drain regions 576 can comprise, for example, phosphorous doped silicon (Si:P), but is not limited thereto. The pFET is formed on the compressively strained semiconductor layer 503 and includes a gate 560 formed on a gate dielectric 562. Dielectric spacers 564 are formed on sides of the gate 560 and gate dielectric 562. Source/drain regions 578 are formed on the compressively strained semiconductor layer 503 on sides of the spacers 564. The source/drain regions 578 can comprise, for example, boron doped SiGe (SiGe:B), but is not limited thereto.

Figure 22:
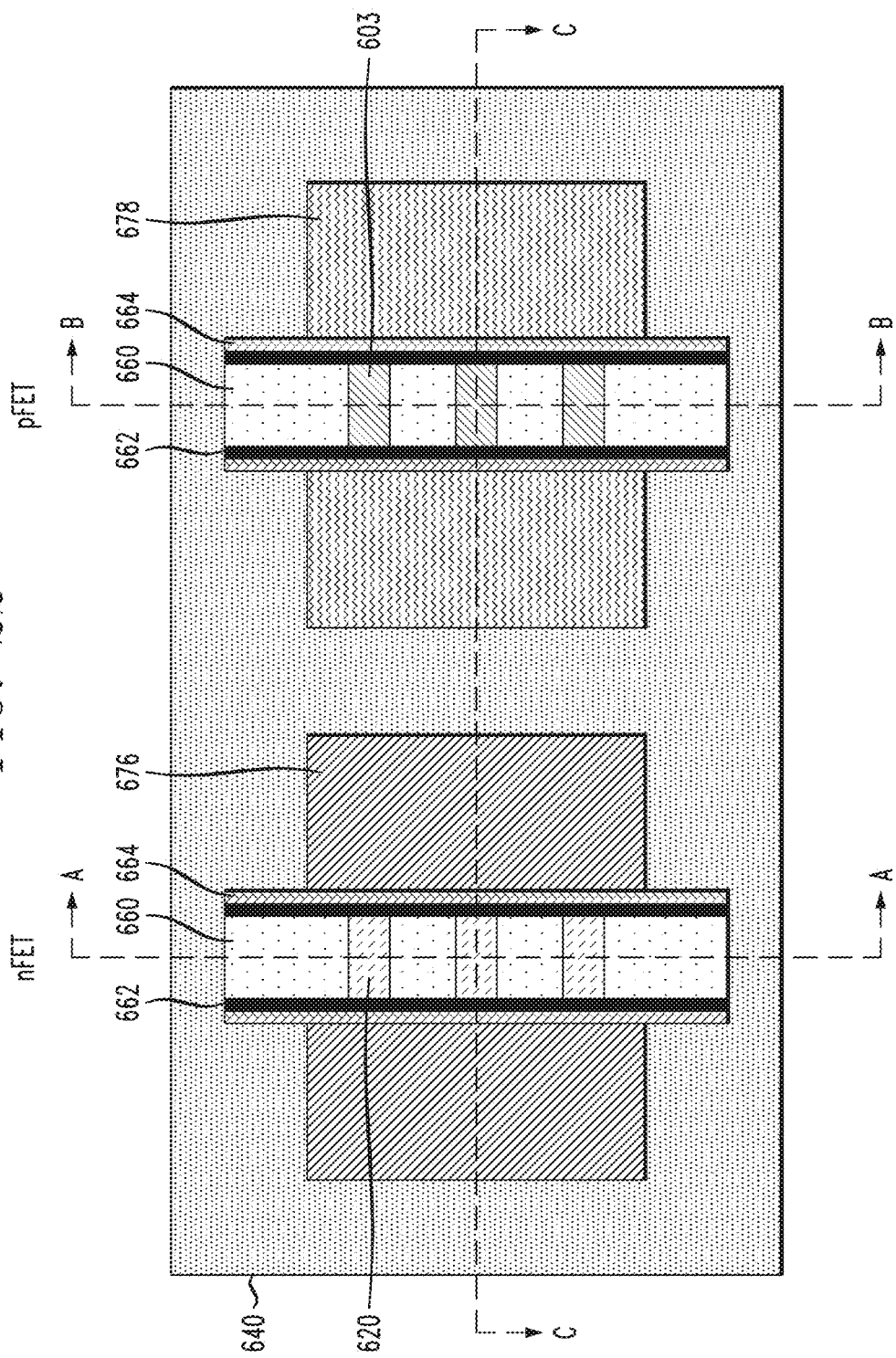
FIG. 22 is a top-down view of a fin field-effect transistor (FinFET) CMOS device, according to an exemplary embodiment of the present invention.
Figure 23B:
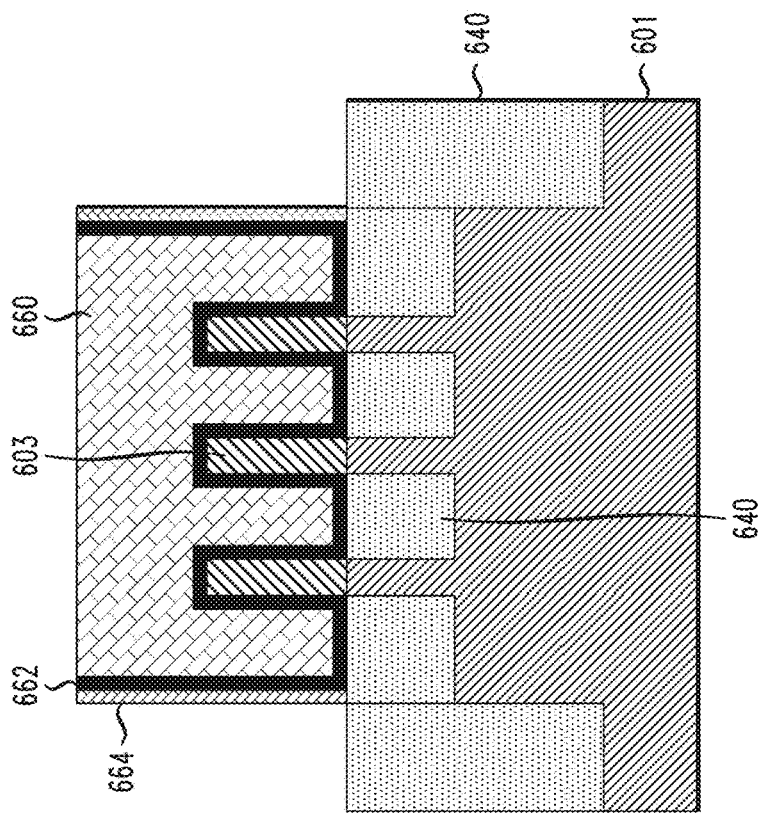
FIGS. 23A and 23B are cross-sectional views of a fin field-effect transistor (FinFET) CMOS device, according to an exemplary embodiment of the present invention.
Figure 23A:
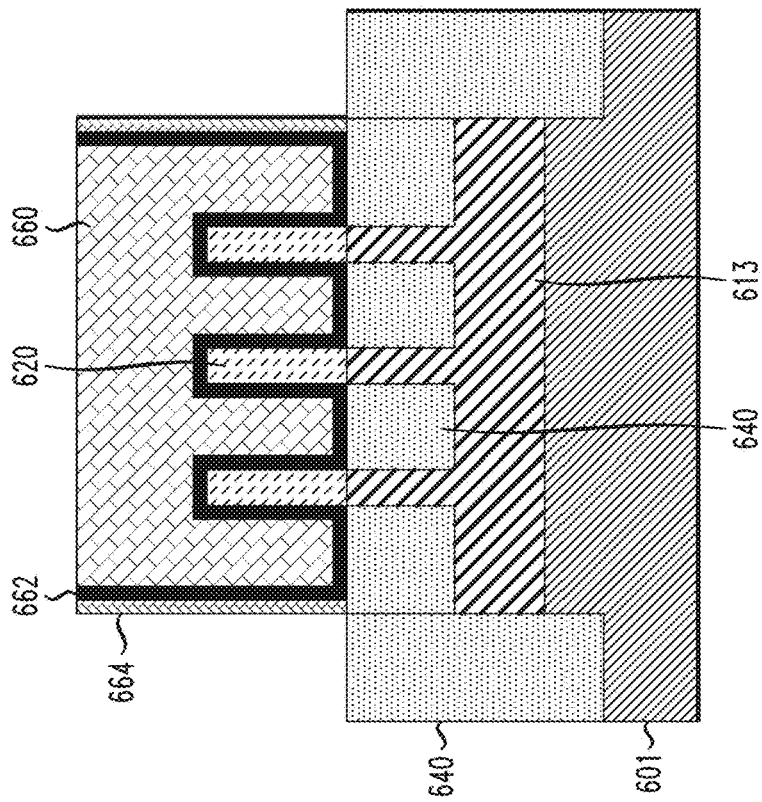
Figure 24:
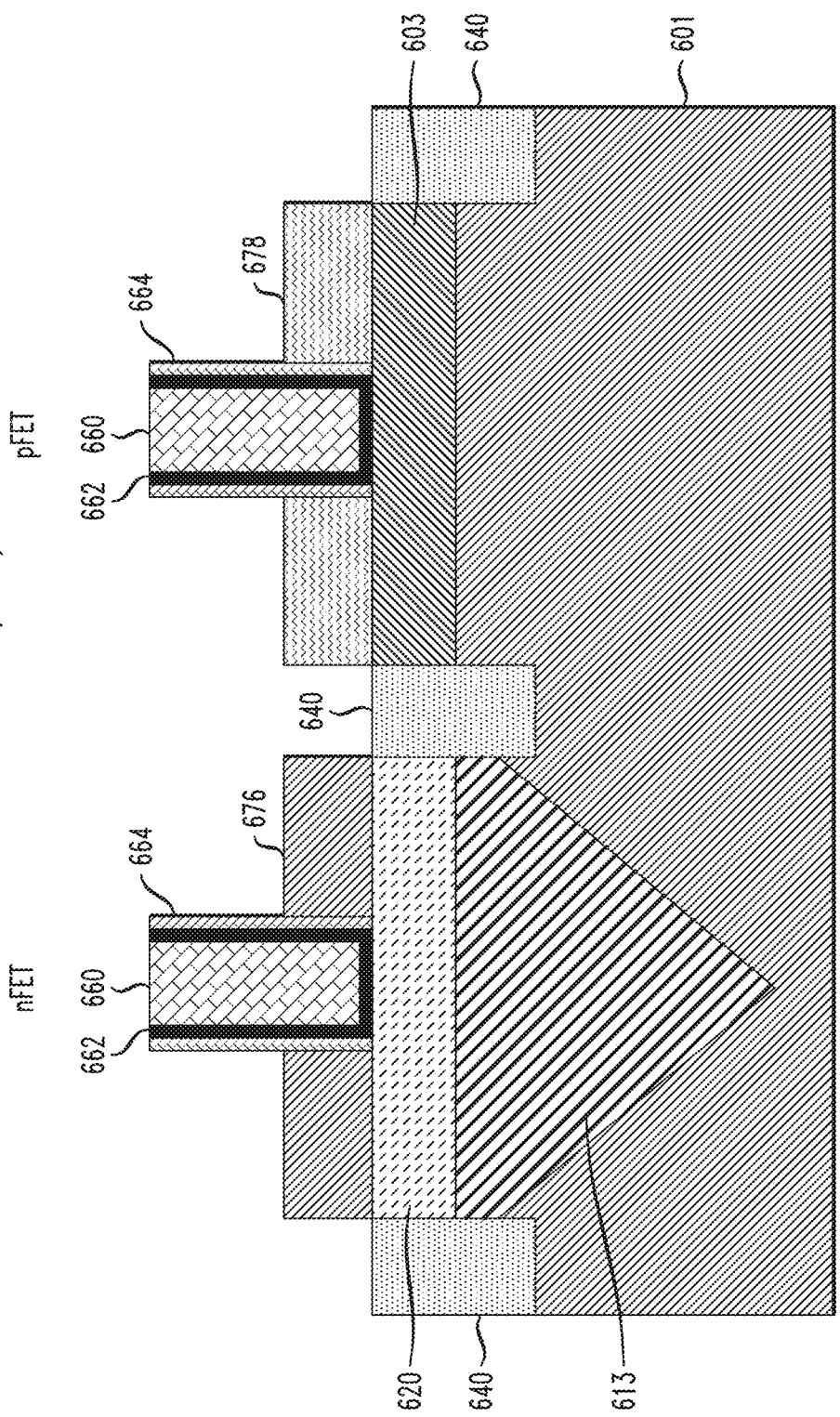
FIG. 24 is a cross-sectional view of a fin field-effect transistor (FinFET) CMOS device, according to an exemplary embodiment of the present invention.

FIG. 22 is a top-down view of a fin field-effect transistor (FinFET) CMOS device, according to an exemplary embodiment of the present invention. FIGS. 23A, 23B and 24 are cross-sectional views of the FinFET CMOS device, taken along the lines A-A, B-B, and C-C of FIG. 22 respectively. In order to illustrate the compressively and tensile strained semiconductor layers 603, 620 under the gates 660 in FIG. 22, the gate 660 in FIG. 22 is shown as transparent.

Referring to FIGS. 22, 23A, 23B and 24, a FinFET CMOS device includes an nFET on a left side and a pFET on a right side formed on a substrate 601 including a patterned compressively strained semiconductor layer 603, a patterned buffer layer 613, and a patterned tensile strained semiconductor layer 620 manufactured in accordance with the embodiments of the present invention described herein. End portions of the compressively strained semiconductor layer 603 and the tensile strained semiconductor layer 620 may be removed where isolation regions 640 (e.g., shallow trench isolation (STI) regions) are formed on the substrate 601. In accordance with an embodiment of the present invention, the compressively strained semiconductor layer 603 and the tensile strained semiconductor layer 620 are formed as fins around which the gates 660 are formed to function as channel regions of the FinFETs. In connection with the nFET, a portion of the buffer layer 613 is patterned into the fin-like shapes so that the tensile strained semiconductor layer 620 can grow as fins from the underlying buffer layer 613. Similarly, in connection with the pFET, the substrate 601 is patterned into the fin-like shapes so that the compressively strained semiconductor layer 603 can grow as fins from the underlying substrate 601. In addition to being shown in FIGS. 23A and 23B, the fins for the semiconductor layers 603 and 620 are also shown under the transparent gates 660 in FIG. 22.

The nFET is formed on the tensile strained semiconductor layer 620, and the pFET is formed on the compressively strained semiconductor layer 603. Each of the nFET and pFET include a gate 660 formed on a gate dielectric 662, such as, for example a high-k dielectric. As can be seen, the gate dielectric 662 lines sidewall surfaces of the spacers 664 and top surfaces of isolation regions 640 at a bottom of the gate 660. The gate dielectric 662 is further formed around side and top surfaces of the patterned compressively strained semiconductor layer 603 for the pFET, and around side and top surfaces of the patterned tensile strained semiconductor layer 620 for the nFET. A gate 660 is formed on the gate dielectric layer 662 on sidewall and bottom surfaces and around side and top surfaces of the patterned compressively and tensile strained semiconductor layers 603, 620 for the nFET and pFET, respectively.

Dielectric spacers 664 are formed on sides of the gate 660 and gate dielectric 662. Source/drain regions 676, 678 are respectively formed on the tensile strained and compressively strained semiconductor layers 620 and 603, on sides of the spacers 664. The source/drain regions 676 can comprise, for example, phosphorous doped silicon (Si:P), and the source/drain regions 678 can comprise, for example, boron doped SiGe (SiGe:B), but are not limited thereto.

The gate dielectric layer 562 includes, but is not necessary limited to, SiBCN, SiOCN, SiOC, SiN, $SiO_2$ or other appropriate dielectric. The gate dielectric layer 662 includes, for example, a high-K dielectric layer including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum pentoxide) or other dielectric. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The gates 560 and 660 can include, for example, a work-function metal (WFM) layer, including but not necessarily limited to, for a PFET, titanium nitride (TiN), tantalum nitride (TaN) or ruthenium (Ru), and for an NFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN. The gates 560, 660 may further include, but are not necessarily limited to, metals, such as, for example, tungsten, cobalt, zirconium, tantalum, titanium, aluminum, ruthenium, and/or copper, metal carbides, metal nitrides, transition metal aluminides, tantalum carbide, titanium carbide, tantalum magnesium carbide, or combinations thereof deposited on the WFM layer.

It is to be noted that depending on a material of the substrate, that alternate embodiments of the present invention may allow for NFET and PFET regions and their corresponding strained structures to be reversed. For example, the embodiments described herein depict a structure with a silicon substrate, compressively strained SiGe PFET regions on the substrate, SiGe buffer layers and tensile strained silicon NFET regions on the buffer layers as a non-limiting example. However, the embodiments of the present invention are not limited thereto, and also include, as a non-limiting example, an SiGe substrate, tensile strained silicon NFET regions on the substrate (where the compressively strained SiGe PFET regions are located in the reverse embodiments described herein), silicon buffer regions and compressively strained SiGe PFET regions on the buffer layers (where the tensile strained silicon NFET regions are located in the reverse embodiments described herein).

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
   a first device region on a substrate;
   a second device region on the substrate;
   a first strained semiconductor layer on the substrate in the first device region, the first strained semiconductor layer having a first type of strain;
     wherein the substrate comprises a first crystalline orientation at a top surface of the substrate;
   at least one trench in the substrate in the second device region, wherein sidewalls of the at least one trench have a second crystalline orientation different from the first crystalline orientation;
   a buffer layer in the at least one trench; and
   a second strained semiconductor layer on the buffer layer, the second strained semiconductor layer having a second type of strain;
   wherein the first type of strain is different from the second type of strain; and
   wherein a surface of the buffer layer parallel to the top surface of the substrate is substantially free of strain;
   a first fin field effect transistor comprising a first plurality of fins formed from the first strained semiconductor layer; and
   a second field effect transistor comprising a second plurality of fins formed from the second strained semiconductor layer;
   wherein a portion of the substrate is formed in a plurality of first fin shapes under the first plurality of fins;
   wherein a portion of the buffer layer is formed in a plurality of second fin shapes under the second plurality of fins; and
   wherein interfaces between the plurality of first fin shapes and the first plurality of fins and between the plurality of second fin shapes and the second plurality of fins are coplanar with top surfaces of isolation regions contacting gate dielectric layers of the first and second field effect transistors.

2. The semiconductor device according to claim 1, wherein the first type of strain has an opposite strain polarity from the second type of strain.

3. The semiconductor device according to claim 1, wherein the first type of strain is compressive strain and the second type of strain is tensile strain.

4. The semiconductor device according to claim 3, wherein the first fin field effect transistor is a p-type fin field effect transistor and the second fin field effect transistor is an n-type fin field effect transistor.

5. The semiconductor device according to claim 1, wherein the first crystalline orientation is {100} and the second crystalline orientation is {111}.

6. The semiconductor device according to claim 1, wherein the buffer layer has a defect density less than 100 defects/cm$^2$.

7. The semiconductor device according to claim 1, wherein the surface of the buffer layer parallel to the top surface of the substrate has a strain level less than 0.3%.

8. The semiconductor device according to claim 1, wherein the at least one trench has a faceted shape.

9. A semiconductor device, comprising:
a first device region on a substrate;
a second device region on the substrate;
a first strained semiconductor layer on the substrate in the first device region, the first strained semiconductor layer having a first type of strain;
at least one trench in the substrate in the second device region;
a buffer layer in the at least one trench;
a second strained semiconductor layer on the buffer layer, the second strained semiconductor layer having a second type of strain;
wherein the first type of strain is different from the second type of strain; and
wherein a surface of the buffer layer parallel to a top surface of the substrate is substantially free of strain;
a first fin field effect transistor comprising a first plurality of fins formed from the first strained semiconductor layer; and
a second field effect transistor comprising a second plurality of fins formed from the second strained semiconductor layer;
wherein a portion of the substrate is formed in a plurality of first fin shapes under the first plurality of fins;
wherein a portion of the buffer layer is formed in a plurality of second fin shapes under the second plurality of fins; and
wherein interfaces between the plurality of first fin shapes and the first plurality of fins and between the plurality of second fin shapes and the second plurality of fins are coplanar with top surfaces of isolation regions contacting gate dielectric layers of the first and second field effect transistors.

10. The semiconductor device according to claim 9, wherein the first type of strain has an opposite strain polarity from the second type of strain.

11. The semiconductor device according to claim 9, wherein the first type of strain is compressive strain and the second type of strain is tensile strain.

12. The semiconductor device according to claim 11, wherein the first fin field effect transistor is a p-type fin field effect transistor and the second fin field effect transistor is an n-type fin field effect transistor.

13. The semiconductor device according to claim 9, wherein the buffer layer has a defect density less than 100 defects/cm$^2$.

14. The semiconductor device according to claim 9, wherein the surface of the buffer layer parallel to the top surface of the substrate has a strain level less than 0.3%.

* * * * *